United States Patent [19]

Ota et al.

[11] Patent Number: 5,074,245
[45] Date of Patent: Dec. 24, 1991

[54] DIAMOND SYNTHESIZING APPARATUS

[75] Inventors: Nobuhiro Ota; Naoji Fujimori, both of Hyogo, Japan

[73] Assignee: Sumitomo Electric Industries, Ltd., Osaka, Japan

[21] Appl. No.: 584,911

[22] Filed: Sep. 18, 1990

[30] Foreign Application Priority Data

Sep. 20, 1989 [JP] Japan .................................. 1-245748
Aug. 31, 1990 [JP] Japan .................................. 2-231650

[51] Int. Cl.$^5$ ............................................ C23C 16/00
[52] U.S. Cl. .................................... 118/719; 118/723; 118/715; 423/466; 156/DIG. 68
[58] Field of Search ...................... 118/723, 719, 715; 423/466; 156/DIG. 68

[56] References Cited

U.S. PATENT DOCUMENTS

| | | | |
|---|---|---|---|
| 3,030,187 | 4/1962 | Eversole . | |
| 3,030,188 | 4/1962 | Eversole . | |
| 4,468,283 | 8/1984 | Ahmed | 118/728 |
| 4,940,015 | 7/1990 | Kobashi | 118/723 |

OTHER PUBLICATIONS

USSR Inv. Certificate No.: 339134, 1958.
"Vapor Deposition of Diamond Particles from Methane", by Matsumoto et al.; Japanese Journal of Applied Physics, vol. 21, No. 4 (1982).
"Diamond Synthesis from Gas Phase in Microwave Plasma", by Kamo et al.; Journal of Crystal Growth 62 (1983) 642–644.

Primary Examiner—Richard Bueker
Attorney, Agent, or Firm—W. G. Fasse; D. H. Kane, Jr.

[57] ABSTRACT

A diamond synthesizing apparatus has a reaction tube for internally causing a reaction for vapor-phase synthesizing diamond. A plasma generator produces the required microwave plasma in the reaction tube. The reaction tube is coupled with a gas reservoir, which forms a circulation system with the reaction tube. The circulation system is connectable to an exhaust for evacuating its interior. This circulation system further includes a pump for circulating raw material gas, which is a compound containing carbon. A raw material gas supply is also connectable to the circulation system, for intermittently supplying the raw material gas into the circulation system. During the synthesizing operation the circulation system is completely closed. According to this diamond synthesizing apparatus, it is possible to keep pressure fluctuations and composition fluctuations following a reaction and gas addition, to the minimum and to vapor-phase synthesize diamond in very restricted ranges of gas composition and pressure. Further, the consumption of the raw material gas is substantially reduced and the gas concentration in the reaction tube changes only very slowly and smoothly in gas supply, thus, an adverse influence caused by changes in the gas concentration on the film quality, is substantially eliminated.

12 Claims, 3 Drawing Sheets

DIAMOND SYNTHESIZING APPARATUS

FIELD OF THE INVENTION

The present invention relates to a diamond synthesizing apparatus, and more particularly, it relates to a diamond synthesizing apparatus which provides a technique for vapor-phase synthesizing high-quality diamonds in a microwave plasma at a low cost.

BACKGROUND INFORMATION

A technique for synthesizing diamonds out of the vapor-phase was started by Derjaguin (USSR Inv. Certif. No. 339134, 1958) in 1956 and by Eversole (USP Nos. 3,030,187 and 3,030,188) in 1958, and has been vigorously developed since 1982, based on a study made by Matsumoto et al. (Japanese Journal of Applied Physics, Vol. 21, 1982, L183 to L185).

A microwave plasma CVD process of synthesizing a diamond in plasma excited by microwaves was invented by Kamo et al. (Journal of Crystal-Growth, 62, 1983, pp. 642–644) in 1983. According to this process, it is possible to obtain a film containing no impurity due to an electrodeless discharge. Thus, the cost for such a film has been reduced by an increase in the formation area and by an increased growth rate.

Such a conventional method of vapor-phase synthesizing diamond in plasma has been basically carried out through the so-called open type apparatus which does not circulate any material gas, as shown in FIG. 1. Referring to FIG. 1, a raw material gas supply system 1 supplies raw material gas, which is prepared by mixing about 1 to 2% of carbon source gas with about 99% of medium gas, into a reaction tube 3 through a raw material gas supply valve 2. The carbon source gas is prepared from hydrocarbon such as methane, ethane, propane, acetylene or benzene, alcohol such as methanol, ethanol or propanol, organic acid such as acetic acid, ketone such as acetone, ester such as methyl acetate, carbon monoxide, carbon dioxide, or the like. The medium gas is prepared from hydrogen or oxygen. The carbon source gas and the medium gas are reacted in the plasma for synthesizing diamond. Merely 1 to 2% of the carbon source gas employed for such reaction is converted into diamond in practice. The raw material gas, including unreacted carbon source gas, once subjected to the reaction is entirely exhausted by an exhaust system 5 through an exhaust valve 4. Further, the pressure in a vacuum vessel is regulated by controlling the raw material gas supply system 1 and the exhaust system 5. Plasma generation means 6 generate the plasma in the reaction tube 3. This plasma generation means 6 includes a microwave oscillator 7 and a waveguide 8. In general, the microwave oscillator 7 generates microwaves at a frequency of 2.45 GHz, while a for synthesizing diamond, while a tuner 10 and a plunger 11 adjust the waveguide 8, which is monitored by a power monitor 9, in order to conform the same to the frequency of the microwaves.

It has been confirmed that it is possible to obtain a film type or thin-plate type diamond of high quality, the performance of which is equivalent to that of natural diamond or bulk type diamond synthesized by a super-high pressure synthesizing method, in accordance with diamond vapor-phase synthesis, particularly the microwave plasma CVD process, by restricting synthesis conditions. More specifically, it has been possible to obtain diamond having a Vickers hardness of 10000, which is equivalent to that of a single crystal of diamond. Further, it has also been possible to attain a thermal conductivity of 16 W/cm·K, which is not necessarily inferior to the value 22 W/cm·K of a single crystal type IIa diamond and the value 11 W/cm·K of type Ia diamond. Further, a heat sink or a rear portion is used in the form of a plate-type film or a film provided on a base material. Thus, it is possible to considerably save time for working according to the vapor-phase synthesizing method, which is adapted to already define a film or a plate having a thickness of several to hundreds of millimeters in film formation. However, a step of cutting diamond in the form of a plate by laser cutting or the like is required when single-crystalline diamond is employed. In the existing circumstances, however, sufficient results cannot be obtained as to the vapor-phase synthesized diamond, due to cost problem. To this end, cost reductions are of interest in every aspect, in relation to an extension of the formation area and an increase in the growth rate. In order to extend the formation area in the microwave plasma CVD process, efforts have been made to improve the methods of generating plasma in various ways.

Generally, the formation area is extended by the following two means: The first means employs an apparatus using a large-diameter microwave plasma process, as shown in FIG. 2. According to the first means, the effect of the introduced microwaves are enlarged by a tapered waveguide 21 so that plasma 23 is generated in a bell jar 22 by the microwaves, thereby vapor-phase synthesizing a diamond film on a wafer 26 provided on a holder 25 which is rotated by a rotation drive mechanism 24. According to this first means, the wafer 26 is made of a silicon substrate of 4 inches in diameter, and the growth rate is about 0.2 $\mu$m/hr.

The second means employs an apparatus using an ECR plasma process, as shown in FIG. 3. According to this second means, electromagnetic coils 33 apply a magnetic field to the microwaves for increasing the impingeable surface area whereby the microwaves travel from a waveguide 31 having a small rectangular sectional area, into a trapezoidal cylindrical waveguide 32. Thus, ECR plasma 36 is generated in the vicinity of the surface of a substrate 35 which is heated by a heater 34, thereby synthesizing a diamond film out of the vapor phase on the surface of the substrate 35. When this means is employed, the substrate 35 is prepared from a silicon substrate of 2 inches in diameter, with a diamond film growth rate of about 0.1 $\mu$m/hr.

When the aforementioned open type vapor-phase synthesizing apparatus is employed, however, the film quality is reduced in the means for extending the film forming area shown in FIGS. 2 and 3. Although attempts have been made to increase the pressure the, concentration of fuel gas and the like in order to increase the growth rate, in particular, no success has been attained due to the instability of the plasma and due to deposition of a non-diamond component such as graphite. While an attempt has also been made to rotate the substrate in order to homogenize the plasma, portions of relatively good quality overlap with defective portions, whereby the film quality as a whole is reduced. Further, the film quality tends to be lowered in film areas away from the central portion of the plasma. The just described techniques are still in the stages of development. According to the above described methods, the growth rate is generally limited to about 1

μm/hr. under pressure of 40 Torr. Area increase and high-speed film formation are limited, and values of at least 4 inches in diameter and about 10 μm/hr. are regarded preferable. The conventional open type apparatus cannot possibly attain such values.

Other problems of the conventional open type vapor synthesizing apparatus for vapor-phase synthesizing diamond are as follows:

Merely a few percent of the supplied carbon source gas is subjected to reaction, and the remaining part thereof is exhausted from the system in an unreacted state. Further, the medium gas, which is required to occupy approximately 99% of the overall raw material gas, is finally exhausted in an unreacted and unchanged state. In other words, the known apparatus requires the raw material gas in an amount 5000 times that of the carbon source gas which is converted into diamond in practice. Thus, the material expense takes the greater part of the cost for diamonds which are vapor-phase synthesized at a relatively small equipment cost. Namely, it is necessary to effectively use the raw material gas, in order to reduce the material expense.

On the other hand, it has been confirmed that fluctuations in the pressure and in the raw material composition, exert bad influence on the synthesis of a high quality film. Further, valves of the supply and exhaust systems must be operated in a complicated operation for regulating the pressure and the raw material composition, and it is difficult to stabilize the conditions for a long-time operation. Thus, the valves must be finely controlled by an operator, leading to a high cost. If such pressure regulation is automated, the equipment cost is substantially increased to raise the overall costs. Hence, it is also necessary to simplify the valve operation and pressure regulation, in order to implement an automated operation.

In order to solve these problems, a chemical reactor may be sealed to circulate raw material gas and supply carbon source gas only for an amount consumed for synthesizing diamond, thereby effectively using the raw material. Further, it is conceivable that no pressure regulation is required in such a sealed system since the reaction space is sealed, and hence a valve operation can be simplified. However, in such a reaction wherein a carbon source gas is decomposed in a plasma to generate diamond, the following reaction (1) generally progresses if the carbon source gas is made of a hydrocarbon, for example:

$$C_xH_y \rightarrow xC + y/2H_2 \qquad (1)$$

Due to such a reaction, the pressure in the sealed reaction vessel is increased by the generated hydrogen gas to exert an influence on the plasma state whereby the film quality deteriorates, except for the case of y=2. Further, the carbon source gas itself is a bulk as expressed in the following formula (2), to cause similar problems:

$$nC_xH_y \rightarrow C_{nx}H_{ny-\alpha} + \alpha/2H_2 \qquad (2)$$

Thus, it is difficult to stably control the raw material gas concentration or to avoid a pressure increase by merely sealing the reaction tube 3 of the conventional open type apparatus for vapor-phase sinthesis.

SUMMARY OF THE INVENTION

An object of the present invention is to provide a diamond synthesizing apparatus which can stably synthesize diamond out of the vapor-phase with a smaller consumption of raw material gas at a low cost, by stably controlling the pressure of the raw material gas in a plasma state in a sealed circulation system.

The diamond synthesizing apparatus of the invention comprises a reaction tube for internally reacting a vapor-phase for synthesizing a diamond out of the vapor-phase, and plasma generation means for generating the required microwave plasma in the reaction tube. The reaction tube is coupled with a gas reservoir which defines a sealed circulation system with the reaction tube. This circulation system comprises means for evacuating its interior. The circulation system further comprises means for circulating raw material gas, which is a compound containing carbon, in a sealed state and raw material gas supply means for intermittently supplying the raw material gas into the circulation system which is sealed when raw material gas is not supplied into the circulation system.

According to the present diamond synthesizing apparatus, the raw material gas is circulated in the normally sealed circulation system in a sealed state. In other words the required raw material gas is intermittently supplied following a reduction of the raw material by the vapor-phase synthesizing of diamond in the reaction tube. In the apparatus of the invention pressure fluctuations and composition fluctuations are reduced to a minimum during the reaction so that the addition of raw material gas is also reduced to a minimum. Thus, diamond can be synthesized from the vapor phase with very limited. Further, the consumption of the raw material gas has been very much reduced whereby the amount of the raw material gas consumed according to the invention is not more than 2% compared to the gas consumption in the conventional open type apparatus. In combination addition, the of the sealed circulation system with an intermittently operated gas reservoir, assures that the gas concentration in the reaction tube changes very slowly and smoothly due to the intermittent gas supply. Thus, even if the gas is intermittently supplied by a simple carbon source gas supply system which comprises an electromagnetic valve combined with a timer, for example, no influence is exerted on the film quality.

In another aspect of the present invention, the diamond synthesizing apparatus comprises a plurality of reaction tubes which are arranged in parallel in a normally sealed circulation system. Each of the plurality of reaction tubes is provided with independent plasma generation means for generating the required microwave plasma.

Due to such a structure, it is possible to enlarge the capacity for the vapor-phase reaction without significantly increasing the equipment cost by increasing only the number of the reaction tubes and the plasma generating means while maintaining the raw material gas supply system, the exhaust system and the circulation system in common for all reaction tubes.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
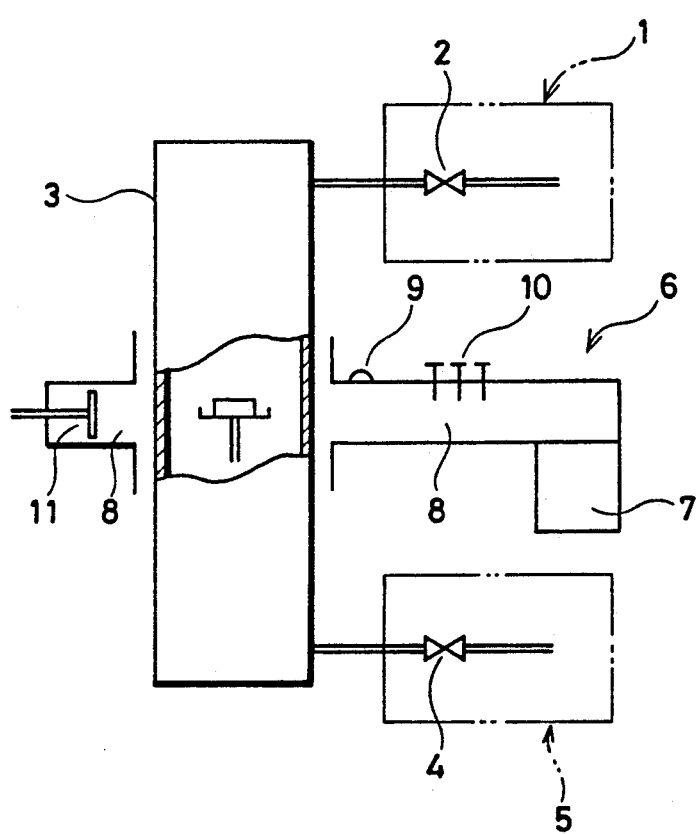
FIG. 1 illustrates the structure of a conventional open type diamond synthesizing apparatus.
Figure 2:
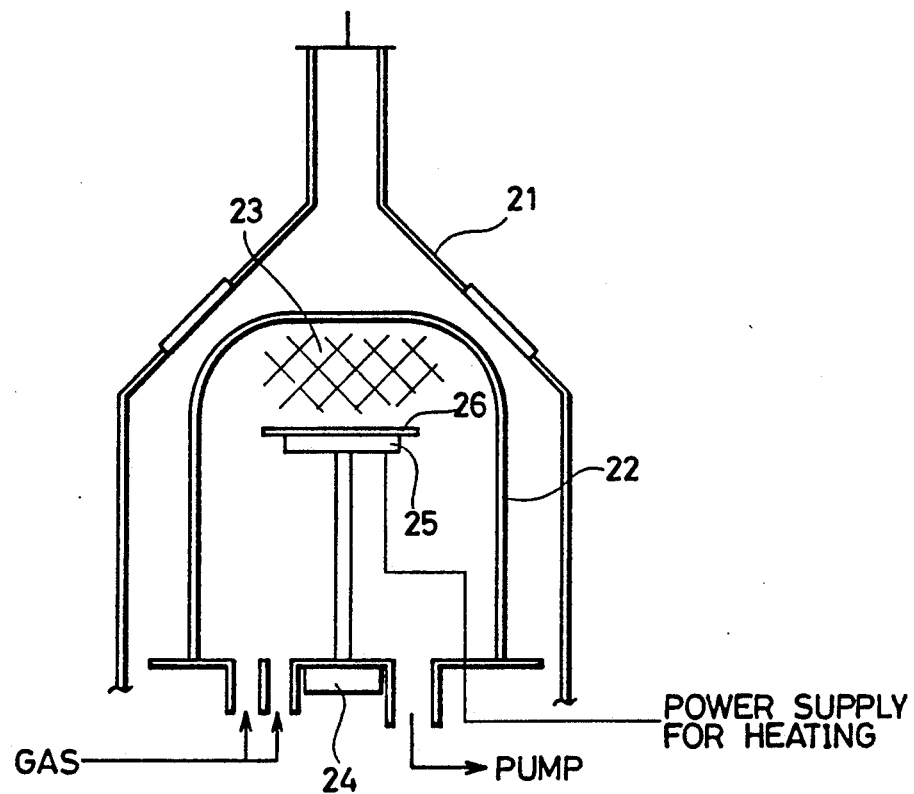
FIG. 2 is a sectional view showing a conventional diamond synthesizing apparatus using a large-diameter microwave plasma processing device.
Figure 3:
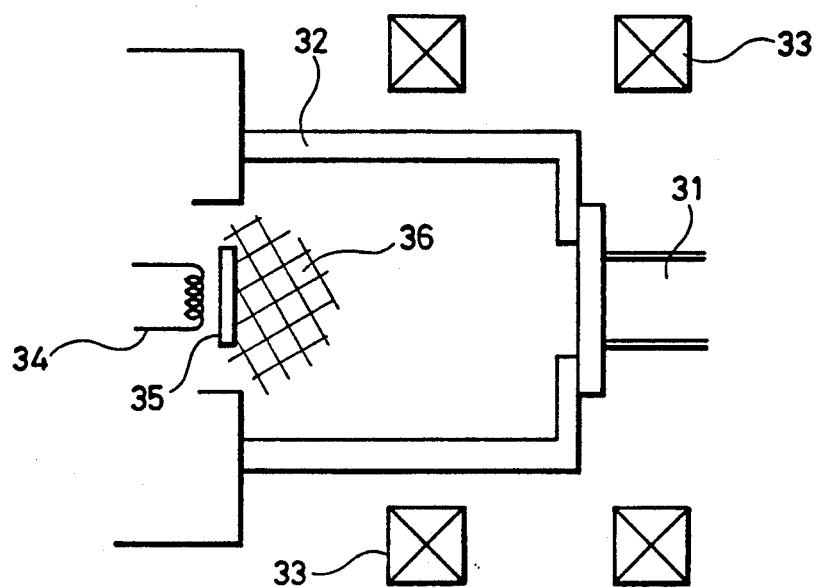
FIG. 3 is a sectional view showing a conventional diamond synthesizing apparatus utilizing an ECR plasma process.
Figure 4:
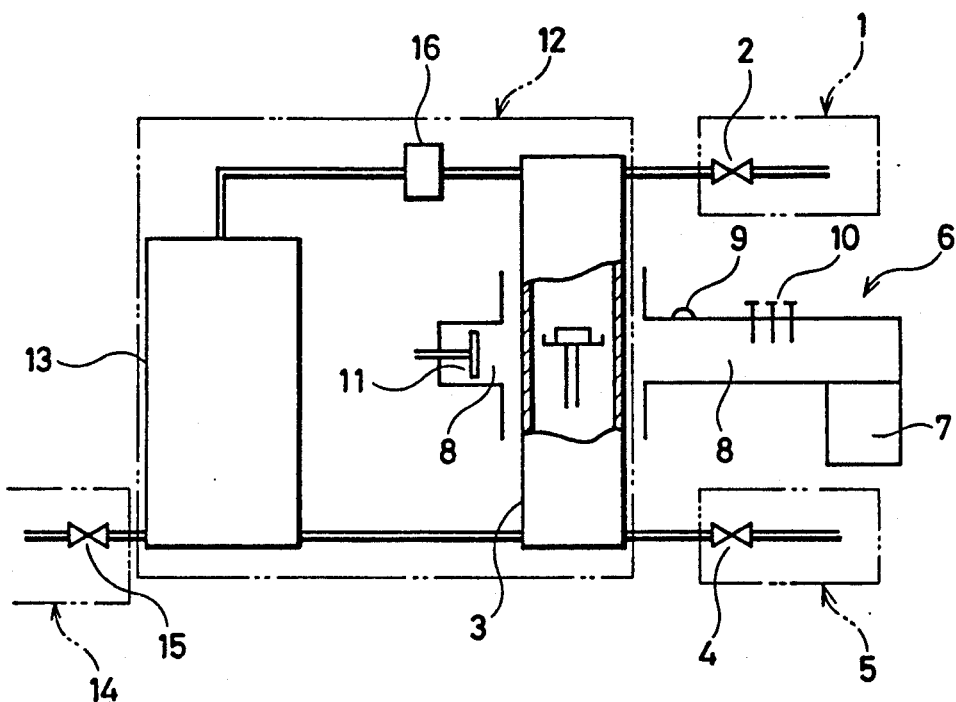
FIG. 4 illustrates the structure of a diamond synthesizing apparatus according to a first embodiment of the present invention.

A first embodiment of the present invention will now be described with reference to FIG. 4, wherein a raw material gas supply valve 2 of a raw material gas supply system 1 is closed and an exhaust valve 4 of an exhaust system 5 is opened first, to evacuate a reaction tube 3 and a gas reservoir 13 defining a circulation system 12 that is closed off or sealed during deposition, from the supply 1 by the valve 2 and from the exhaust 5 by the valve 4. An operation begins by first exhausting the circulation system 12 through the exhaust 5 with the valve 4 open. Then the exhaust valve 4 is closed and the raw material gas supply valve 2 is opened to supply raw material gas until a prescribed pressure is attained in the system 12 whereupon the valve 2 was closed. Carbon source gas and medium gas are supplied in a prescribed ratio to prepare the raw material gas. The pressure in the circulation system 12 is regulated by controlling the raw material gas supply system 1 and the exhaust system 5. The gas reservoir 13 is coupled to a carbon source gas supply system 14, and supplied with the carbon source gas through a carbon source gas supply valve 15 when needed. When the raw material gas supply valve 2, the exhaust valve 4 and the carbon source gas supply valve 15 are closed simultaneously, the circulation system 12 is cut off from the exterior to define a sealed system that remains sealed during deposition, while the raw material gas sealed in the circulation system 12 is circulated therein by a circulation pump 16 during deposition.

Plasma generation means 6 generate plasma in the reaction tube 3. The plasma generation means 6 is mainly formed by a microwave oscillator 7 and a waveguide 8. The microwave oscillator 7 generates microwaves of 2.45 GHz. The waveguide 8 is adjusted by a tuner 10 and a plunger 11 while being monitored by a power monitor 9 in conformity with the frequency of the microwaves.

The apparatus according to this embodiment was employed for vapor-phase synthesizing diamond under the following operating conditions: The apparatus was evacuated first, and then the raw material supply valve 2 was opened to supply 10 ml/min. of methane gas and 1000 ml/min. of hydrogen gas into the reaction tube 3 until the pressure in the circulation system 12 reached 40 Torr. Thereafter the raw material supply valve 4 is closed to seal the circulation system 12. The valves 2 and 15 have already been closed and the circulation system 12 is now sealed. The reaction tube 3 was made of a cylindrical silica tube of 40 mm in inner diameter. The microwave output was about 400 W. It is noted that the microwave output is not restricted to the general range of 300 to 500 W. Optimum film forming conditions, may be influenced by the positional relation between the substrate and the plasma. As to relation between the configuration of the reaction tube and the microwave output, higher output is required as the thickness of the reaction tube is increased. Considering microwave leakage, the diameter of the reaction tube should be within the range of 40 to 60 mm in the apparatus of this embodiment.

Then the plasma generation means 6 is switched on to generate plasma in the reaction tube 3, thereby starting the synthesis of diamond. Thereafter the carbon source gas supply valve 15 was opened every hour to intermittently introduce methane gas. The amount of the intermittently introduced methane gas was determined on the basis of an experimentally obtained value of variation in the methane gas concentration in the circulation system 12.

As the result of the diamond synthesis, the pressure in the closed system increased up to 41.5 Torr from the above mentioned initial pressure of 40 Torr after a lapse of 50 hours from the time of starting the vapor-phase synthesis. The pressure was increased because the methane gas serving as the raw material, was decomposed and bulked with the generation of the diamond film as hereinabove described, whereby hydrogen was produced.

Thereafter the plasma formation was stopped and the sample was extracted after evacuation, to be subjected to SEM observation and Raman spectrum analysis. As a result, it was confirmed that diamond was synthesized, which compared favorably with that synthesized by a conventional open type vapor-phase synthesizing apparatus with valve adjustment performed by an operator.

A deterioration of the film quality can be clearly observed through a break of a diamond crystal configuration in an SEM observation. In general, diamond is in the form of a hexahedron or a hexa-octahedron, while a high-quality diamond has flat planes as well as linear and clear contours. If the film quality deteriorates, however, the planes and contours are rounded and slackened. The amount of the used raw material gas was calculated and it was found that a diamond of about 10 mm square and 50 μm thick was synthesized with a raw material gas quantity of 1.4% of that needed in the open type apparatus.

A problem of pressure fluctuation in this embodiment is considered as follows: In a conventional method, the pressure is regulated by controlling the supply of raw material gas and hydrogen gas by a mass flow controller and controlling the gas discharge by operation of a valve on a vacuum pump side. Thus, it can be said that a composition fluctuation is hardly caused. On the other hand the conventional, pressure fluctuation is about ±2.5% depending on performance of the valve and the vacuum pump. However, according to the method of this embodiment of the invention, the pressure fluctuation and composition fluctuation are caused by generation of hydrogen gas resulting from the decomposition of the raw material gas, as hereinabove described. The widths of such a fluctuation are determined by the quantity of generated diamond and the capacity of a reservoir tank. If diamond having a size of about 10 mm square and 50 μm thick is generated as hereinabove described and about the same amount of carbon is decomposed and deposited on a substrate support material or an inner wall of a reaction tube, the pressure is raised up from 40 Torr to 41.8 Torr when the capacity of the reservoir tank is 100 liters. The composition fluctuation depends on the concentration of the methane gas. The concentration is changed from 1% to 0.96% only, if an amount of the consumed methane gas is added. Thus, the range of fluctuation is held to 4.5%. The pressure fluctuation must be maintained within a range of −5%. If the pressure fluctuation is out of this range, the plasma state and the substrate temperature are changed so that optimum conditions no longer prevail, whereby the film quality deteriorates. The composition fluctuation does not lead to any deterioration of the film quality but causes a reduction in the film forming rate, if the concentration of the raw material gas, such as methane gas is reduced. If the concentration of the raw material gas is increased, on the other hand, it the film quality deteriorates even if the increase is small. Experience has shown that the pressure fluctuation must be held within a range of −10% to 0%.

According to this embodiment, as hereinabove described, the circulation system 12 defined by the reaction tube 3 and the gas reservoir 13 is sealed and the raw material gas is circulated to vapor-phase synthesize diamond in the plasma, whereby consumption of the raw material gas can be greatly decreased to reduce costs.

Further, since the raw material gas is circulated in the sealed system which can easily maintain a constant pressure and a small amount of methane gas is intermittently supplied, the pressure fluctuation and the composition fluctuation following reaction and gas addition can be held to the minimum and it is possible to automatically and stably synthesize a high-quality diamond, which can be synthesized in very restricted or limited ranges of the gas composition and of the pressure, without requiring any manual operation.

Figure 5:
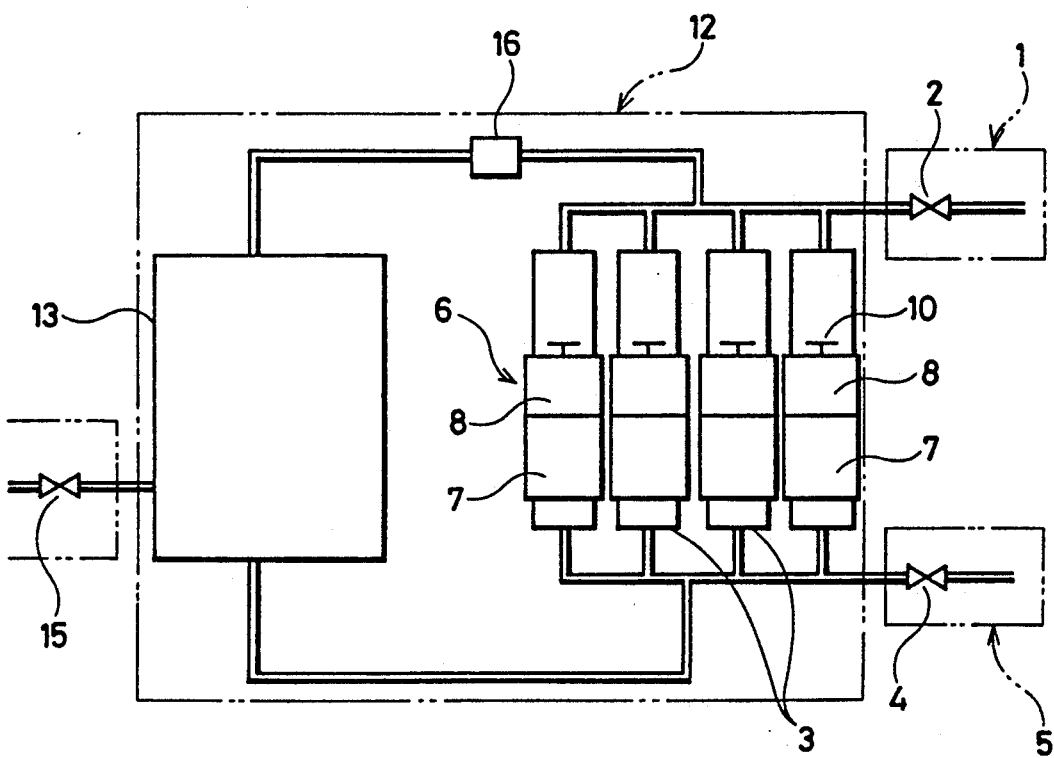
FIG. 5 illustrates the structure of a diamond synthesizing apparatus according to a second embodiment of the present invention.

A second embodiment of the present invention will now described with reference to FIG. 5.

The apparatus of this embodiment comprises a raw material gas supply system 1, an exhaust system 5, a circulation system 12 also sealed during operation and a carbon source gas supply system 14. These components are the same as the aforementioned first embodiment. This embodiment is different from the first embodiment in that a plurality of reaction tubes 3 and a plurality of plasma generation means 6 are arranged in parallel in the circulation system 12. Each reaction tube has its own plasma generation means 6 similary to the apparatus shown in FIG. 4. Referring to FIG. 5, each of the plasma generation means 6 is illustrated in a manner viewed from a right side of the plasma generation means 6 shown in FIG. 4.

The apparatus of this embodiment was employed to synthesize diamond under actual operating conditions similar to those for the aforementioned first embodiment. The quantity of the intermittent supply of methane gas in this embodiment was controlled or adjusted by a gas supply mass flow controller. As the result of such diamond synthesis, the pressure in the circulation system 12 reached 41.7 Torr after a lapse of 50 hours after starting of the synthesis. Thereafter the plasma generation was stopped and the sample was extracted after evacuation and subjected to SEM observation and Raman spectrum analysis, to confirm that diamond was synthesized, which compared favorably with that synthesized by a conventional open type apparatus with valves controlled by an operator. The amount of the used raw material was calculated to find that diamond was synthesized from a quantity of raw material gas of 1.78% of the quantity needed in the open system apparatus.

According to Raman spectrum analysis, observed are a sharp diamond peak appearing at 1333 cm$^{-1}$, a signal of amorphous carbon smoothly appearing at 1500 to 1700 cm$^{-1}$, and relatively broad peaks of graphite appearing at 1360 cm$^{-1}$ and 1600 cm$^{-1}$. It can be said that only a diamond peak appears in a high-quality film by Raman spectrum analysis. If a signal of amorphous or graphite appears, it means that the film quality is deteriorated.

According to this embodiment, as hereinabove described, it is possible to increase only the numbers of the reaction tubes 3 and the plasma generation means 6 while providing the raw material gas supply system 1, the exhaust system 5, and the circulation system 12 in common for all tubes 3, thereby greatly reducing the equipment costs.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A diamond synthesizing apparatus comprising: a reaction tube (3) for performing a reaction for synthesizing a diamond out of a vapor-phase; plasma generation means (6) for generating a required microwave plasma in said reaction tube (3); a gas reservoir (13) for holding a reaction gas, conduit means connecting said reaction tube (3) to said gas reservoir for forming a normally closed circulation system (12), means (5) for evacuating said normally closed circulation system (12), first valve means (4) for connecting and disconnecting said evacuating means (5) to and from said normally closed circulation system (12), pump means (16) for circulating a raw material gas compound containing carbon within said normally closed circulation system (12) when said normally closed circulation system is in a sealed state, raw material gas supply means (1) for intermittently supplying said reaction gas into said normally closed circulation system (12), and further valve means (2) for connecting and disconnecting said gas supply means (1) to and from said closed circulation system (12), said first and further valve means being closed to completely seal said closed circulating system (12) during its operation.

2. The diamond synthesizing apparatus in accordance with claim 1, wherein said raw material gas supply means (1) comprise a raw material gas supply system for mixing carbon source gas and medium gas to form a gas mixture, said further valve means (2) in its open state supplying said gas mixture into said normally closed circulation system (12), said apparatus further comprising a carbon source gas supply system (14) and normally closed third valve means (15) for intermittently supplying said carbon source into said gas reservoir (13).

3. The diamond synthesizing apparatus in accordance with claim 1, wherein said plasma generation means (6) comprise a waveguide (8) positioned for cooperation with said reaction tube (3) for generating said microwave plasma in said reaction tube (3) and a microwave oscillator (7) connected to one end of said wave guide (8).

4. The diamond synthesizing apparatus in accordance with claim 3, wherein said plasma generation means (6) comprises a power monitor (9) for monitoring an output value of microwaves generated by said microwave oscillator (7), a tuner for adjusting the frequency of said microwaves, and a plunger (11) provided on another end of said waveguide (8) opposite to said one end connected with said microwave oscillator (7), for adjusting the line length of said waveguide (8).

5. The diamond synthesizing apparatus in accordance with claim 1, wherein said pump means (16) for circulating said raw material gas when said normally closed circulation system (12) is in said sealed state comprises a circulation pump (16) which is mounted in a conduit of said conduit means connecting said reaction tube (3) with said gas reservoir (13).

6. The diamond synthesizing apparatus in accordance with claim 2, wherein said raw material gas supply system provides said raw material gas compound by mixing hydrogen gas and any gas selected from hydrocarbon, alcohol, organic acid, carbon monoxide and carbon dioxide.

7. The diamond synthesizing apparatus comprising: a plurality of reaction tubes (3) interconnected in parallel with each other for performing a reaction for synthesizing a diamond out of a vapor-phase; a plurality of plasma generation means (6) including one plasma generator for each of said plurality of reaction tubes (3) for generating a required microwave plasma in each of said reaction tubes (3); a gas reservoir (13) for holding a reaction gas, conduit means connecting said reaction tubes to said gas reservoir (13) for forming a normally closed circulation system (12); means (5) for evacuating said normally closed circulation system (12); pump means (16) for circulating a raw material gas compound containing carbon within said normally closed circulation system (12) when said normally closed circulation system is in a sealed state; raw material gas supply means (1) for intermittently supplying said reaction gas into said normally closed circulation system (12), and further valve means (2) for connecting and disconnecting said gas supply means (1) to and from said closed circulation system (12), said first and further valve means being closed to completely seal said closed circulation system (12) during its operation.

8. The diamond synthesizing apparatus in accordance with claim 7, wherein said raw material gas supply means (1) comprise a raw material gas supply system (1) for mixing carbon source gas with medium gas to form a gas mixture, said further valve means (2) in its open state supplying said gas mixture into said normally closed circulation system (12), said apparatus further comprising a carbon source gas supply system (14) and normally closed third valve means (15) for intermittently supplying said carbon source gas into said gas reservoir (13).

9. The diamond synthesizing apparatus in accordance with claim 7, wherein said plasma generation means (6) comprise waveguides (8) positioned for cooperation with said reaction tubes (3) for generating said microwave plasma in said reaction tubes (3) and microwave oscillators (7) connected to first ends of said waveguides (8).

10. The diamond synthesizing apparatus in accordance with claim 9, wherein said plasma generation means (6) comprise power monitors (9) for monitoring an output value of microwaves generated by said microwave oscillators (7), tuners (10) for adjusting the frequency of said microwaves, and plungers (11) provided on other ends of said waveguides (8) opposite to said first ends coupled with said microwave oscillators (7), for adjusting the line lengths of said waveguides (8).

11. The diamond synthesizing apparatus in accordance with claim 7, wherein said pump means (16) for circulating said raw material gas when said normally closed circulation systems (12) is in said sealed state comprises a circulation pump (16) which is mounted in a conduit of said conduit means connecting said reaction tubes (3) with said gas reservoir (13).

12. The diamond synthesizing apparatus in accordance with claim 8, wherein said raw material gas supply system provides said raw material gas compound by mixing hydrogen gas and any gas selected from hydrocarbon, alcohol, organic acid, carbon monoxide and carbon dioxide.

* * * * *